United States Patent [19]

Frijlink

[11] Patent Number: 4,976,217
[45] Date of Patent: Dec. 11, 1990

[54] EPITAXY REACTOR HAVING AN IMPROVED GAS COLLECTOR

[75] Inventor: Peter Frijlink, Crosne, France

[73] Assignee: U.S. Philips Corporation, New York, N.Y.

[21] Appl. No.: 412,965

[22] Filed: Sep. 26, 1989

[30] Foreign Application Priority Data

Oct. 14, 1988 [FR] France ............................ 88 13565

[51] Int. Cl.$^5$ ............................................ C23C 26/00
[52] U.S. Cl. .................................... 118/733; 118/715; 118/725
[58] Field of Search ................. 118/715, 725, 733

[56] References Cited

U.S. PATENT DOCUMENTS 4,607,591  8/1986  Stitz ...................................... 118/724

FOREIGN PATENT DOCUMENTS 2596070  9/1987  France .

Primary Examiner—Richard Bueker
Attorney, Agent, or Firm—Norman N. Spain

[57] ABSTRACT

An epitaxy reactor of the type having a planetary platform for semiconductor wafers. At the periphery of this planetary support (4), a baffle plate (17) for gas distribution is disposed, which is provided with regularly distributed holes (12).

According to the invention, this baffle plate comprises two cylinders or quasi cylinders, i.e. an upper cylinder (17) and a lower cylinder (3) sliding one into the other and forming parts of the same conduit having the form of a passage (16) surrounding the platform, the other parts (18) of this conduit acting as a spring, which tends to cause the upper cylinder (17) to rise with respect to the lower cylinder (3) bearing on the platform.

6 Claims, 1 Drawing Sheet

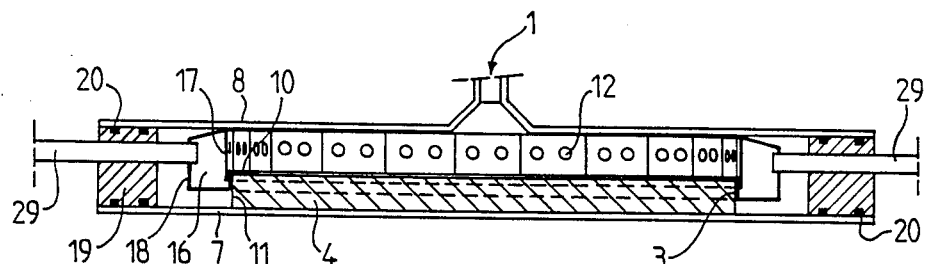
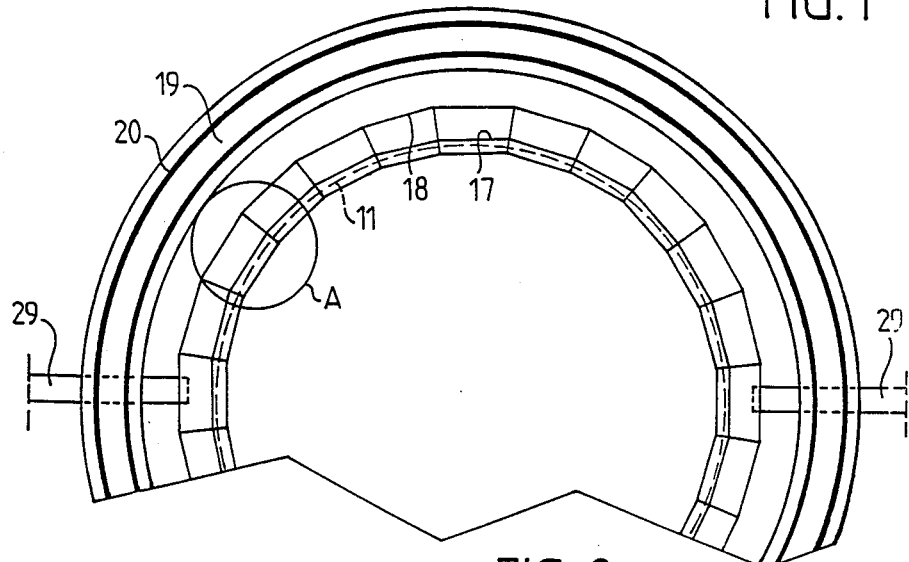
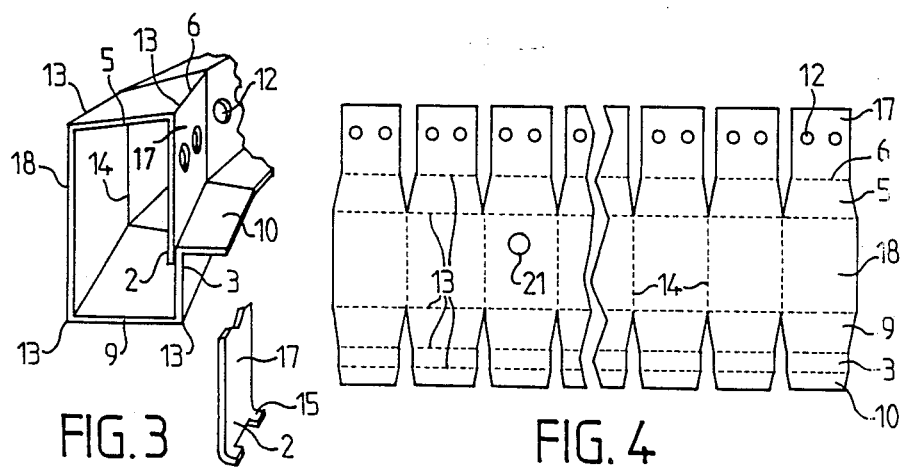

EPITAXY REACTOR HAVING AN IMPROVED GAS COLLECTOR

BACKGROUND OF THE INVENTION

The invention relates to an epitaxy reactor comprising a space containing a platform for supporting semiconductor wafers with a circulation of gas between the centre and the periphery of the platform, which space is closed by a cover which is substantially flat and is parallel to the platform during operation, while a gas-conducting crown comprises a baffle plate, which surrounds the platform and is provided with inlets regularly distributed along the periphery of the platform.

Such a reactor is discribed in the document FR-A-88 03 688 (PHF. 88514). In the reactor described in this document, the crown is a circular crown of quartz constituting a vertical baffle plate, which surrounds the platform, is provided with regularly spaced slots and is placed on the bottom of the space of the reactor.

Such a crown of a rigid material has the disadvantage that, the larger the space chosen between the crown and the cover, the greater is the possibility that gases pass through this space and leave there dirtying deposits, whereas, the narrower the space is chosen, the greater is the risk of cracking if a hard foreign body wider than the said space falls unfortunately onto the crown before the cover is pressed. There is no satisfying compromise. Of course, the use of a rubber gasket is entirely excluded in this position because of the temperature.

SUMMARY OF THE INVENTION

The invention proposes a collecting crown, which ensures a good tightness with respect to the cover, does not involve the risk of exerting excessive forces on the cover, supports the temperature prevailing in the reactor at the level of the semiconductor wafers to be treated and is finally chemically resistant to the gases used.

This result is obtained due to the fact that the baffle plate comprises a high part and a low part, the lower edge of the high part being pressed with a possible sliding motion against the upper edge of the low part, while elastic means tend to cause the high part to rise with respect to the low part in order to press said high part against the cover.

FIG. 1 is a diametrical section of a roughly cylindrical reactor;

FIG. 2 is a plan view of the reactor shown in FIG. 1, whose cover is removed;

FIG. 3 is a perspective view on an enlarged scale of a piece of the gas-collecting crown;

FIG. 4 shows a plate from which the conduit is formed by folding.

In a very advantageous embodiment, the elastic means are formed in that the crown is a conduit surrounding the platform and consisting of an elastic plate having on the side of the platform two plate edges which are joined without being fixed together and constitute the aforementioned lower edge of the high part and the aforementioned upper edge of the low part of the baffle plate.

Thus, certain wall parts of the conduit act as a spring with respect to other parts constituting the aforementioned baffle plate.

In order to obtain this conduit, it is advantageous to start from a single plate, the conduit being formed from the parts of said plate folded in themselves on the one hand along horizontal folding lines in order to constitue a closed conduit having a polygonal section and on the other hand along vertical folding lines regularly spaced apart, the conduit thus having the general form of a polygon surrounding the platform.

The plate is preferably a plate of molybdenum.

In order to reduce the zone of contact of the gases with the cover, the conduit advantageously has an inclined roof, whose ridge is situated on the side of the platform.

In a particular embodiment, the crown comprises a horizontal part connected to the low part of the baffle plate and it is placed by means of this horizontal part on the edge of the platform.

Thus, the line along which the crown is placed on the platform constitutes a joining line, which is substantially tight and by which it is avoided that gases penetrate between the edge of the platform and the crown.

In order that the invention may be readily carried out, it will now be described more fully, by way of example, with reference to the figures of the accompanying drawings:

The reactor shown in FIGS. 1 and 2 is roughly cylindrical having a vertical axis. Only the elements essential to the invention are shown.

The reactor is provided with a circular fixed platform 4 having a diameter of about 25 cm, which in turn supports a system of rotating disks not shown, on which the semiconductor wafers are placed and for the description of which the aforementioned document or the document FR-A-2 596 070 can be consulted.

This platform 4 is arranged within a space, in which reactive gases are in contact with the wafers. The space is constituted by a cylindrical body 19 having a vertical axis, which surrounds the supporting platform 4. On the lower and upper sections of said cylindrical body are placed a bottom 7 constituted by a plate and a roughly flat cover 8, respectively. The tightness is ensured by toric joints 20. The cover 8 can be lifted to place the semiconductor wafers to be tracted in position on the platform 4. It is practically parallel to the platform in the position shown during the operation, in which reactive gases are introduced into the space through an inlet 1 (for a detailed description of which reference may again be made to the document mentioned in the opening paragraph) and move radially above the platform 4 towards the periphery of the latter, on which they are collected by a gas-collecting crown 17, 18 provided with regularly spaced holes 12.

A part A (FIG. 2) of said crown is shown in detail in FIG. 3. It consists of an elastic plate of molybdenum folded so that a closed envelope is formed. From one of the edges 2 of the plate, flat plate parts are designated successively by reference numerals 17, 5,18,9,3,10 connected each time to each other each time along a horizontal folding line 13. The plate edges 2 and 3 are joined on the side of the platform without being fixed to each other. Thus, a conduit is formed.

The essential element of this crown is the vertical baffle plate constituted by the parts 17 and 3, the lower edge 2 of the high part 17 being pressed with possible sliding motion against the upper edge 3 of the low part. The horizontal part 10 connected to the low part 3 serves to place the crown on the edge of the platform 4. Moreover, the upper part 5, i.e. the roof of the conduit, is inclined and its ridge 6 is situated on the side of the platform.

Due to vertical folding lines 14, the conduit is divided into successive parts, which enclose an angle with each other, the whole thus constituting a polygon surrounding the platform (in FIG. 2, the partly shown polygon is a polygon having 24 sides).

When the crown is placed on the platform in the reactor, whose cover 8 is not yet in position, the highest part 6 of the crown is slightly higher than the upper surface of the cylindrical body 19 of the reactor. Thus, when the cover 8 is placed in position, the latter bears on the ridge 6 of the roof 5. The part 10 being placed on the fixed platform, the plate parts 3,9,18,5 constitute a spring, which tends to cause the high part to rise with respect to the lwo part 3 in order to press this high part against the cover.

It should further be noted that the force in downward direction exerted on the conduit is applied to the horizontal part 10, also ensuring a firm contact of said part 10 on the platform 4.

The section of FIG. 1 clearly shows that the gas introduced through the inlet 1 cannot pass between the ridge of the crown and the cover 8 and cannot pass either between the horizontal edge 10 and the platform 4. It therefore passes exclusively through the inlets 12 and does not form dirtying deposits, neither on the cover nor on the periphery of the platform.

If a hard particle, for example a broken semiconductor piece, falls onto the upper side of the crown, due to the elasticity of the walls 9,18,6 this does nto involve the risk of cracking of the cover (which is made of quartz and is therefore both fragile and expensive).

Two tubes 29 arranged diametrically opposite each other merge into the interior of the conduit 16 to discharge the gases to the exterior.

Instead of the hole 12, it could be possible, as shown below on the righthand side in FIG. 3, that the wall part 17 is provided with folded lower projections 15 moving the movable edge 2 away from the fixed edge 3 and thus leaving a slot between the edges 2 and 3, through which the gas can then pass.

FIG. 4 shows how the whole conduit can be formed from a plate made of a single cut piece. For example, there are 24 identical parts, of which only the end parts are shown here. The folding lines indicated by dotted lines have the same reference numerals 13,14 as in FIG. 3, just like the conduit parts 10,3,9,18,5,6,17, which permits of immediately understanding how the conduit is obtained. The folding lines are marked, for example, with a dotted line of holes made by means of a laser. Consequently, during manual operation, the plate is folded in itself along the lines provided. The hole 21 is intended for the passage of a tube (29) for gas discharge.

In order to close the conduit around the platform, its two ends can be fixed to each other by means of pincers or any other known mechanical tools.

Variations different from those described above are conceivable, which always correspond at least to the first claim. For example, the conduit may be made of metallic circular strips soldered to each other; the bottom 9 of the conduit may also be placed on the bottom 7 of the reactor, which, however, has the disadvantages indicated above.

I claim:

1. An epitaxy reactor comprising a space containing a platform supporting semiconductor wafers with a circulation of gas between the center and the periphery of the platform, which space is closed by a cover which is substantially flat and is parallel to the platform during operation, while a gas-collecting crown comprises a baffle plate, which surrounds the platform and is provided with inlets regularly distributed along the periphery of the platform, characterized in that the baffle plate comprises a high part and a low part, the lower edge of the high part being pressed against the upper edge of the low part such that two parts are capable of sliding motion, while elastic means tend to cause the high part to rise with respect to the low part in order to press this part against the cover.

2. A reactor as claimed in claim 1, characterized in that the crown is a conduit surrounding the platform and comprising an elastic plate having on the side of the platform, two plate edges, which are joined without being fixed together and constitute said lower edge of the high part and said upper edge of the low part of the baffle plate.

3. A reactor as claimed in claim 2, characterized in that the conduit is formed from a single plate folded in itself along horizontal folding lines in order to constitute a closed conduit having a polygonal section and along vertical folding lines regularly spaced apart, the conduit thus having the general form of a polygon surrounding the platform.

4. A reactor as claimed in claim 2, characterized in that the conduit has an inclined roof, whose ridge is situated on the side of the platform.

5. A reactor as claimed in claim 2, characterized in that the plate is a plate of molybdenum.

6. A reactor as claimed in claim 1, characterized in that the crown comprises a horizontal part connected to the low part of the baffle plate and said crown is placed on the edge of the platform by means of said horizontal part.

* * * * *